(12) United States Patent
Kim et al.

(10) Patent No.: US 9,054,240 B2
(45) Date of Patent: Jun. 9, 2015

(54) SOLAR CELL AND METHOD FOR MANUFACTURING THE SAME

(75) Inventors: Sunyoung Kim, Seoul (KR); Choul Kim, Seoul (KR); Youngho Choe, Seoul (KR); Sungeun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 783 days.

(21) Appl. No.: 12/705,532

(22) Filed: Feb. 12, 2010

(65) Prior Publication Data

US 2010/0206369 A1 Aug. 19, 2010

(30) Foreign Application Priority Data

Feb. 13, 2009 (KR) .................. 10-2009-0012024

(51) Int. Cl.
| | | |
|---|---|---|
| H01L 31/00 | (2006.01) | |
| H01L 31/0224 | (2006.01) | |
| H01L 31/0352 | (2006.01) | |
| H01L 31/068 | (2012.01) | |
| H01L 31/18 | (2006.01) | |

(52) U.S. Cl.
CPC ...... *H01L 31/022441* (2013.01); *H01L 31/035281* (2013.01); *H01L 31/03529* (2013.01); *H01L 31/0682* (2013.01); *H01L 31/1804* (2013.01); *Y02E 10/52* (2013.01); *Y02E 10/547* (2013.01)

(58) Field of Classification Search
CPC .............. H01L 31/0682; H01L 31/022441; H01L 31/03529; H01L 31/035281
USPC ............................................. 136/255
See application file for complete search history.

(56) References Cited

U.S. PATENT DOCUMENTS

| | | | | |
|---|---|---|---|---|
| 4,315,097 A | * | 2/1982 | Solomon ................. | 136/255 |
| 4,479,027 A | * | 10/1984 | Todorof ................. | 136/249 |
| 5,024,953 A | * | 6/1991 | Uematsu et al. ......... | 438/71 |
| 5,053,083 A | * | 10/1991 | Sinton ................... | 136/256 |
| 5,961,742 A | * | 10/1999 | Tange et al. ............ | 136/256 |

(Continued)

FOREIGN PATENT DOCUMENTS

| | | | |
|---|---|---|---|
| DE | 102008055476 | * | 6/2010 |
| JP | 2008-186927 A | | 8/2008 |
| JP | 2009-021494 A | | 1/2009 |

OTHER PUBLICATIONS

Nijs J. et al., "Overview of solar cell technologies and results on high efficiency multicrystalline silicon substrates", Solar Energy Materials and Solar Cells, Elsevier Science Publishers, Amsterdam, NL, vol. 48, No. 1-4, Nov. 1, 1997, pp. 199-217, XP004111851.

*Primary Examiner* — Allison Bourke
(74) *Attorney, Agent, or Firm* — Birch, Stewart, Kolasch & Birch, LLP

(57) ABSTRACT

A solar cell and a method for manufacturing the same are disclosed. The solar cell includes a semiconductor layer containing first impurities, a first portion positioned on a first part of one surface of the semiconductor layer, the first portion being more heavily doped with second impurities different from the first impurities than the semiconductor layer, a second portion positioned on a second part of the one surface of the semiconductor layer, the second portion being more heavily doped with the first impurities than the semiconductor layer, and a third portion positioned between the first portion and the second portion, the third portion having an impurity concentration lower than an impurity concentration of the first portion and an impurity concentration of the second portion.

14 Claims, 13 Drawing Sheets

(56) References Cited

U.S. PATENT DOCUMENTS

| | | |
|---|---|---|
| 7,339,110 B1 | 3/2008 | Mulligan et al. |
| 2001/0050404 A1 | 12/2001 | Saito et al. |
| 2004/0200520 A1* | 10/2004 | Mulligan et al. ............ 136/256 |
| 2005/0016585 A1 | 1/2005 | Munzer |
| 2007/0151598 A1 | 7/2007 | De Ceuster et al. |
| 2007/0256728 A1* | 11/2007 | Cousins ...................... 136/252 |
| 2007/0264746 A1 | 11/2007 | Onishi et al. |
| 2008/0067622 A1* | 3/2008 | Bui et al. .................... 257/458 |

\* cited by examiner

SOLAR CELL AND METHOD FOR MANUFACTURING THE SAME

This application claims priority to and the benefit of Korean Patent Application No. 10-2009-0012024 filed in the Korean Intellectual Property Office on Feb. 13, 2009, the entire contents of which are incorporated herein by reference.

BACKGROUND OF THE INVENTION

1. Field of the Invention

Embodiments of the invention relate to a solar cell and a method for manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted.

A silicon solar cell generally includes a substrate and an emitter layer, each of which is formed of a semiconductor, and a plurality of electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter layer) and the separated holes move to the p-type semiconductor (e.g., the substrate), The electrons and holes are respectively collected by the electrodes electrically connected to the emitter layer and the electrodes electrically connected to the substrate. The electrodes are connected to one another using electric wires to thereby obtain electric power.

However, in the solar cell, because the electrodes are formed on the emitter layer on an incident surface of the substrate, on which light is incident, as well as a non-incident surface of the substrate, on which light is not incident, an incident area of light decreases. Hence, efficiency of the solar cell is reduced.

Accordingly, a back contact solar cell, in which all of electrodes collecting electrons and holes are formed on a back surface of a substrate, was developed so as to increase the incident area of light.

SUMMARY OF THE INVENTION

In one aspect, there is a solar cell including a semiconductor layer containing first impurities, a first portion positioned on a first part of one surface of the semiconductor layer, the first portion being more heavily doped with second impurities different from the first impurities than the semiconductor layer, a second portion positioned on a second part of the one surface of the semiconductor layer, the second portion being more heavily doped with the first impurities than the semiconductor layer; and a third portion positioned between the first portion and the second portion, the third portion having an impurity concentration lower than an impurity concentration of the first portion and an impurity concentration of the second portion.

The impurity concentration of the third portion may be substantially equal to or higher than an impurity concentration of the semiconductor layer.

The first portion and the second portion may be spaced apart from each other by the third portion in vertical and horizontal directions.

The first impurities may be n-type impurities, and the second impurities may be p-type impurities.

The first portion may protrude further than the second portion.

The third portion may include a depression based on an imaginary inclined surface between the first portion and the second portion. The third portion may include a protrusion based on an imaginary inclined surface between the first portion and the second portion. The third portion may include a fourth portion having a first inclination and a fifth portion having a second inclination between the first portion and the second portion, the second inclination being greater than the first inclination.

The fourth portion and the fifth portion may be protrusions based on an imaginary inclined surface between the first portion and the second portion.

The first portion may be positioned closer to the fourth portion than the fifth portion.

A base surface of the first portion may be positioned at a higher level than an upper surface of the second portion.

A distance between the first portion and the second portion in a vertical direction may be greater than a distance between the first portion and the second portion in a horizontal direction.

The solar cell may further include an anti-reflection layer on a surface opposite the one surface of the semiconductor layer.

The one surface of the semiconductor layer may be an incident surface on which light is incident.

In another aspect, there is a solar cell including a semiconductor layer, a first impurity region positioned on a first part of one surface of the semiconductor layer, the first part having a first height, a second impurity region positioned on a second part of the one surface of the semiconductor layer, the second part having a second height different from the first height, and a third portion positioned between the first impurity region and the second impurity region, the third portion having an inclined portion.

The inclined portion may include a depression. The inclined portion may include a protrusion. The inclined portion may include a fourth portion having a first inclination and a fifth portion having a second inclination between the first portion and the second portion, the second inclination being greater than the first inclination. The fourth portion and the fifth portion may be protrusions.

The first portion may be positioned closer to the fourth portion than the fifth portion.

The first height may be greater than the second height.

In another aspect, there is a method for manufacturing a solar cell including doping a semiconductor substrate with first impurities to form a first impurity layer, forming a masking layer on the first impurity layer, forming a resist layer on the masking layer, curing a portion of the resist layer to form a resist pattern having a first portion and a second portion, removing the second portion of the resist layer, a portion of the masking layer underlying the second portion, and a portion of the first impurity layer underlying the second portion to expose a portion of the semiconductor substrate, removing the first portion of the resist layer and the exposed portion of the semiconductor substrate, forming a second impurity layer on the exposed portion of the semiconductor substrate, removing a remaining portion of the masking layer, forming a passivation layer on the second impurity layer and a remaining portion of the first impurity layer, removing a portion of the passivation layer to expose a portion of the remaining portion of the first impurity layer and a portion of the second impurity layer, and forming a first electrode connected to the exposed portion of the first impurity layer and forming a second electrode connected to the exposed portion of the second impurity layer.

The forming of the resist pattern may include forming a portion, to which light or heat is applied, as the first portion of the resist layer and forming a portion, to which the light or the heat is not applied, as the second portion of the resist layer, and crosslinking a resist of the first portion of the resist layer.

The removing of the portions of the masking layer and the first impurity layer underlying the second portion of the masking layer may include removing the portions of the masking layer and the first impurity layer underlying the second portion of the masking layer using an etchant based on inorganic acid containing at least one of hydrofluoric acid, nitric acid, acetic acid, sulfuric acid, and hydrochloric acid.

In another aspect, there is a method for manufacturing a solar cell including doping a semiconductor substrate with first impurities to form a first impurity layer, forming a masking layer on the first impurity layer, forming a resist layer on the masking layer, curing a portion of the resist layer to form a resist pattern having a first portion and a second portion, removing the second portion of the resist layer and the masking layer underlying the second portion to expose a portion of the first impurity layer, removing the first portion of the resist layer, the exposed portion of the first impurity layer, and a portion of the semiconductor substrate underlying the exposed portion of the first impurity layer, forming a second impurity layer on the exposed portion of the semiconductor substrate, removing a remaining portion of the masking layer, forming a passivation layer on the second impurity layer and a remaining portion of the first impurity layer, removing a portion of the passivation layer to expose a portion of the remaining portion of the first impurity layer and a portion of the second impurity layer, and forming a first electrode connected to the exposed portion of the first impurity layer and forming a second electrode connected to the exposed portion of the second impurity layer.

The removing of the first part of the resist layer, the exposed portion of the first impurity layer, and the portion of the semiconductor substrate under the exposed portion of the first impurity layer may include removing the first part of the resist layer, the exposed portion of the first impurity layer, and the portion of the semiconductor substrate underlying the exposed portion of the first impurity layer using a strong alkali etchant.

In another aspect, there is a method for manufacturing a solar cell including doping a semiconductor substrate with first impurities to form a first impurity layer, forming a masking layer on the first impurity layer, forming a resist layer on the masking layer, curing a portion of the resist layer to form a resist pattern having a first portion and a second portion, removing the second portion of the resist layer and a portion of the masking layer underlying the second portion to expose a portion of the first impurity layer, removing the exposed portion of the first impurity layer to expose a portion of the semiconductor substrate, doping the exposed portion of the semiconductor substrate with second impurities to form a second impurity layer, lifting off a remaining portion of the masking layer and the first portion of the resist layer, forming a passivation layer on the second impurity layer and a remaining portion of the first impurity layer, removing a portion of the passivation layer to expose a portion of the remaining portion of the first impurity layer and a portion of the second impurity layer, and forming a first electrode connected to the exposed portion of the first impurity layer and forming a second electrode connected to the exposed portion of the second impurity layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
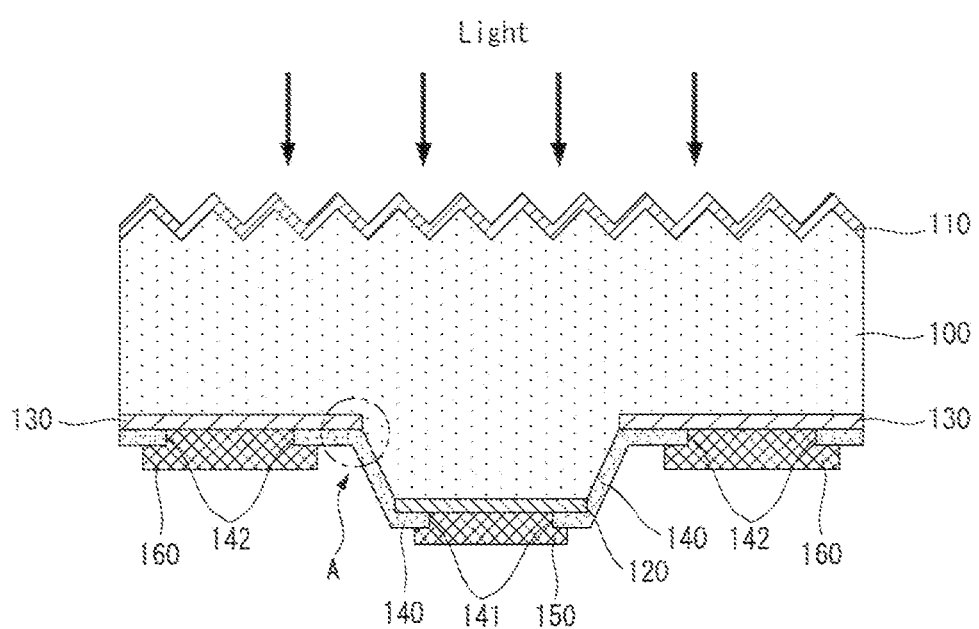
FIGS. 1, 2A, 2B, and 3 to 6 are cross-sectional views schematically showing structures of a solar cell according to embodiments of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

FIGS. 1, 2A, 2B, and 3 to 6 are cross-sectional views schematically showing structures of a solar cell according to embodiments of the invention.

As shown in FIG. 1, a solar cell according to an embodiment of the invention includes a substrate 100, a anti-reflection layer 110 positioned on a surface (hereinafter, referred to as "a front surface") of the substrate 100 on which light is incident, a plurality of first portions 120 and a plurality of second portions 130 positioned on a surface (hereinafter, referred to as "a back surface") of the substrate 100, opposite the front surface of the substrate 100, on which the light is not incident, a passivation layer 140 positioned on portions of the first and second portions 120 and 130, a plurality of first electrodes 150 respectively positioned on the plurality of first portions 120, and a plurality of second electrodes 160 respectively positioned on the plurality of second portions 130.

The substrate 100 is a semiconductor substrate formed of first conductive type silicon doped with first conductive type impurities, for example, n-type silicon, though not required. If the substrate 100 is of the n-type, the substrate 100 may contain impurities of a group V element such as phosphorus (P), arsenic (As), and antimony (Sb). Silicon used in the substrate 100 is crystalline silicon, such as single crystal silicon and polycrystalline silicon, or amorphous silicon.

Alternatively, the substrate 100 may be of a p-type. If the substrate 100 is of the p-type, the substrate 100 may contain impurities of a group III element such as boron (B), gallium (Ga), and indium (In). In addition, the substrate 100 may be formed of semiconductor materials other than silicon.

The front surface of the substrate 100 (i.e., an incident surface of the substrate 100 on which light is incident) is textured to form a textured surface corresponding to an uneven surface. Hence, an amount of light reflected from the front surface of the substrate 100 decreases. Further, because a light incident operation and a light reflection operation are many times performed on the textured surface of the substrate 100, an absorptance of light absorbed in the substrate 100 increases. Thus, the efficiency of the solar cell is improved.

The plurality of first portions 120 and the plurality of second portions 130 are alternately positioned on the back surface of the substrate 100. Further, the first portion 120 and the second portion 130 are spaced apart from each other and extend parallel to each other. Each of the first portions 120 is a heavily doped region doped with impurities (e.g., p-type impurities) of a second conductive type opposite the first conductive type of the substrate 100. In the embodiment, each of the first portions 120 serves as an emitter layer, and thus the substrate 100 and the first portions 120 form a p-n junction.

Each of the second portions 130 is an impurity region (e.g., an $n^+$-type region) that is more heavily doped with impurities (e.g., n-type impurities) of the same conductive type as the substrate 100 than the substrate 100. In the embodiment, each of the second portions 130 serves as a back surface field layer. In other words, a movement of holes to the second electrodes 160 is prevented by a potential barrier resulting from a difference between impurity concentrations of the substrate 100 and the second portions 130. Thus, a recombination and/or a disappearance of electrons and holes around the second electrodes 160 are prevented or reduced.

A plurality of electron-hole pairs produced by light incident on the substrate 100 are separated into electrons and holes by a built-in potential difference resulting from the p-n junction between the substrate 100 and the first portions 120. Then, the separated electrons move to the n-type semiconductor, and the separated holes move to the p-type semiconductor. Thus, when the substrate 100 is of the n-type and the first portions 120 are of the p-type in the embodiment of the invention, the separated holes and the separated electrons move to the first portions 120 and the second portions 130, respectively.

Because the substrate 100 and the first portions 120 form the p-n junction, the first portions 120 may be of the n-type when the substrate 100 is of the p-type unlike the embodiment of the invention described above. In this case, the separated electrons move to the first portions 120, and the separated holes move to the second portions 130.

The passivation layer 140 positioned on the first portions 120 and the second portions 130 has contact holes 141 and 142 exposing portions of the first portions 120 and portions of the second portions 130. The passivation layer 140 is positioned on the substrate 100 between the first portions 120 and the second portions 130.

The passivation layer 140 protects the first portions 120, the second portions 130, and the substrate 100 and converts defects, such as a dangling bond, existing around the surface of the substrate 100 into stable bonds to thereby prevent or reduce a recombination and/or a disappearance of carriers moving to the back surface of the substrate 100. Further, the passivation layer 140 again reflects light passing through the substrate 100 on the substrate 100 to thereby reduce a loss of light incident on the substrate 100.

In the embodiment, the passivation layer 140 has a single-layered structure. However, the passivation layer 140 may have a multi-layered structure such as a double-layered structure and a triple-layered structure.

The plurality of first electrodes 150 are positioned on portions of the first portions 120 exposed by the contact hole 141 and on the passivation layer 140 adjacent to the contact hole 141. The plurality of second electrodes 160 are positioned on portions of the second portions 130 exposed by the contact hole 142 and on the passivation layer 140 adjacent to the contact hole 142. The first electrodes 150 and the second electrodes 160 are electrically separated from one another by the passivation layer 140.

The first electrodes 150 extend substantially parallel to one another and are electrically and physically connected to the first portions 120. Each of the first electrodes 150 collects carriers (e.g. holes) moving to each of the first portions 120.

The second electrodes 160 are spaced apart from the first electrodes 150 and extend substantially parallel to the first electrodes 150. The second electrodes 160 are electrically and physically connected to the second portions 130. Each of the second electrodes 160 collects carriers (e.g. electrons) moving to each of the second portions 130.

As described above, because portions of the first and second electrodes 150 and 160 each have a tip portion overlapping a portion of the passivation layer 140, a contact resistance is reduced in an electrical connection between the first and second electrodes 150 and 160 and an external driving circuit, for example. Hence, contact efficiency is improved. The size of the tip portion is greater than other portions of the first and second electrodes 150 and 160.

The anti-reflection layer 110 on the front surface of the substrate 100 is formed of silicon nitride (SiNx) and/or silicon dioxide ($SiO_2$). Other materials may be used. The anti-reflection layer 110 reduces a reflectance of light incident on the substrate 100 and increases a selectivity of a predetermined wavelength band to thereby increase the efficiency of the solar cell. The anti-reflection layer 110 has a single-layered structure in the embodiment of the invention, but may have a multi-layered structure such as a double-layered structure. The anti-reflection layer 110 may be omitted, if desired.

The solar cell according to the embodiment of the invention having the above-described structure is a back contact solar cell in which the first portions 120 and the second portions 130 as well as the first electrodes 150 and the second electrodes 160 are positioned on the back surface of the substrate 100 on which light is not incident. An operation of the back contact solar cell is described below.

When light irradiated to the solar cell is incident on the substrate 100 through the anti-reflection layer 110, a plurality of electron-hole pairs are generated in the substrate 100 by light energy based on the incident light. Because the front surface of the substrate 100 is the textured surface, a light reflectance in the front surface of the substrate 100 is reduced. Further, a light absorptance increases, and thus the efficiency of the solar cell is improved. In addition, because a reflection loss of the light incident on the substrate 100 is reduced by the anti-reflection layer 110, an amount of light incident on the substrate 100 further increases.

The electron-hole pairs are separated from one another by the p-n junction of the substrate 100 and the first portions 120, and the separated electrons move to the n-type second portions 130 and the separated holes move to the p-type first portions 120. The electrons moving to the n-type second portions 130 are collected by the second electrodes 160, and the holes moving to the p-type first portions 120 are collected by the first electrodes 150. When the first electrodes 150 are connected to the second electrodes 160 using electric wires, current flows therein to thereby enable use of the current for electric power.

In the embodiment of the invention, because the second portions 130 serving as the back surface field layer are positioned on the back surface of the substrate 100, a recombination and/or a disappearance of electrons and holes in the surface of the substrate 100 is prevented or reduced. Hence, the efficiency of the solar cell is improved. Further, because the first portions 120 and the first electrodes 150 as well as the second portions 130 and the second electrodes 160 are positioned on the back surface of the substrate 100, an incident area of the solar cell increases. Hence, the efficiency of the solar cell is further improved.

The embodiment of the invention may be applied to other back contact solar cells as well as the back contact solar cell shown in FIG. 1.

As described above, the embodiment of the invention is described on the assumption that the substrate 100 is an n-type layer, the first portion 120 is a $p^+$-type layer, and the second portion 130 is an $n^+$-type layer. In the embodiment of the invention, a p-type layer and a $p^+$-type layer are regions doped with p-type impurities, and an impurity concentration of the $p^+$-type layer is higher than an impurity concentration of the p-type layer. Further, an n-type layer and an $n^+$-type layer are regions doped with n-type impurities, and an impurity concentration of the $n^+$-type layer is higher than an impurity concentration of the n-type layer.

Figure 2A:
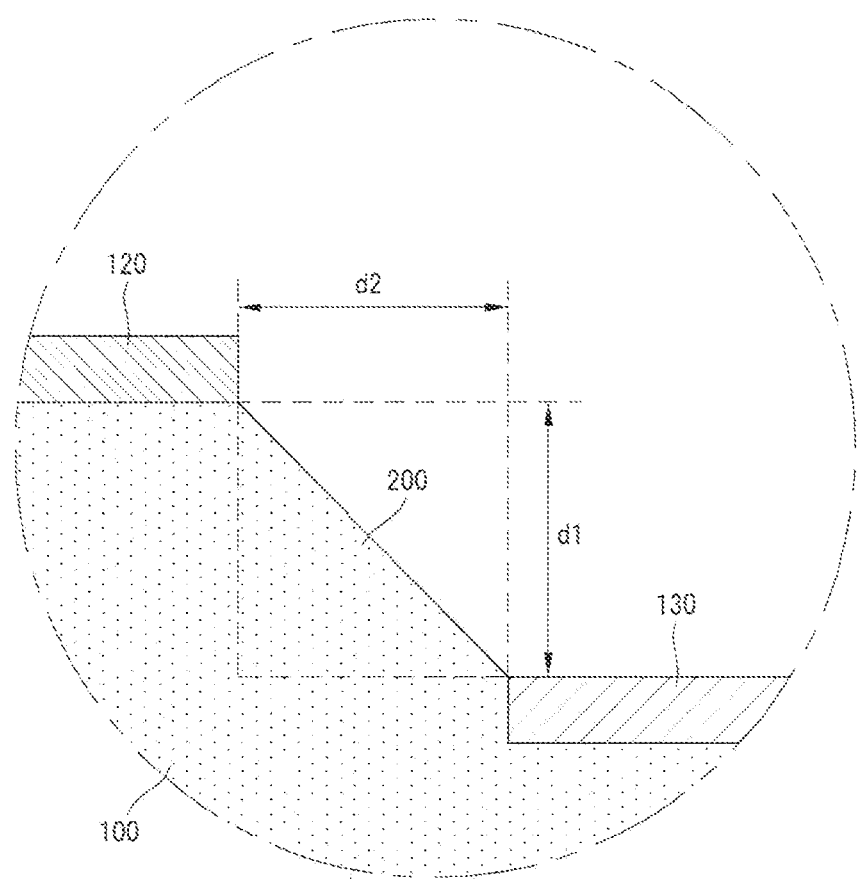

Because the first portion 120 and the second portion 130, as shown in FIG. 2A, are respectively positioned on even surfaces having a height difference of d1 in the back surface of the substrate 100, the first portion 120 and the second portion 130 are spaced apart from each other at a distance (or an interval) of d1 in a vertical direction. Further, the first portion 120 and the second portion 130 are spaced apart from each other at a distance (or an interval) of d2 in a horizontal direction. A third portion 200 is positioned on the substrate 100 between the spaced first and second portions 120 and 130, and an impurity concentration of the third portion 200 is lower than impurity concentrations of the first and second portions 120 and 130. Further, the impurity concentration of the third portion 200 being a region between the spaced first and second portions 120 and 130 is substantially equal to or higher than the impurity concentration of the substrate 100.

As described above, in the embodiment of the invention, because the first portion 120 and the second portion 130 are spaced apart from each other by the third portion 200 in the vertical and horizontal directions, a butting phenomenon is prevented or reduced from occurring.

Figure 3:
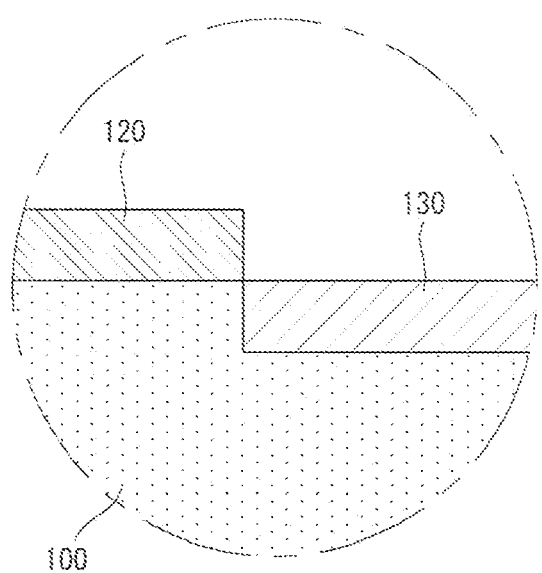

For example, as shown in FIG. 3, when the first portion 120 being the $p^+$-type layer and the second portion 130 being the $n^+$-type layer substantially contact each other or does not contact each other (in this case, the first portion 120 and the second portion 130 are spaced apart from each other at a very short distance), the butting phenomenon, in which a current flow moves between the first portion 120 and the second portion 130, occurs. The butting phenomenon reduces the number of electrons and holes collected by the first electrodes 150 and the second electrodes 160, and thus a photoelectric transformation efficiency is reduced. Hence, the efficiency of the solar cell is reduced.

However, when the first portion 120 and the second portion 130 are spaced apart from each other by the third portion 200 in the vertical and horizontal directions as shown in FIG. 2A, the butting phenomenon is efficiently prevented or reduced by the interval d1 in the vertical direction as well as the interval d2 in the horizontal direction. Hence, the efficiency of the solar cell is improved. It is preferable that the third portion 200 has a proper size to the extent that the first portion 120 and the second portion 130 can be spaced apart from each other in the vertical and horizontal directions. However, when the third portion 200 has the excessively large size, the manufacturing cost of the solar cell may increase because of an unnecessary increase in the size of the solar cell.

Accordingly, it is preferable that the interval d1 in the vertical direction of the third portion 200 is greater than the interval d2 in the horizontal direction of the third portion 200, so as to efficiently prevent or reduce the butting phenomenon while preventing or reducing the unnecessary increase in the size of the solar cell. In other words, the height difference d1 between the first and second portions 120 and 130 is greater than the horizontal distance d2 between the first and second portions 120 and 130.

Further, because the first portion 120 and the second portion 130 are spaced apart from each other in the vertical direction, a base surface of the first portion 120 is positioned at a higher level than an upper surface of the second portion 130. In the embodiment, the base surface of the first portion 120 indicates a lower surface the first portion 120.

Figure 2B:
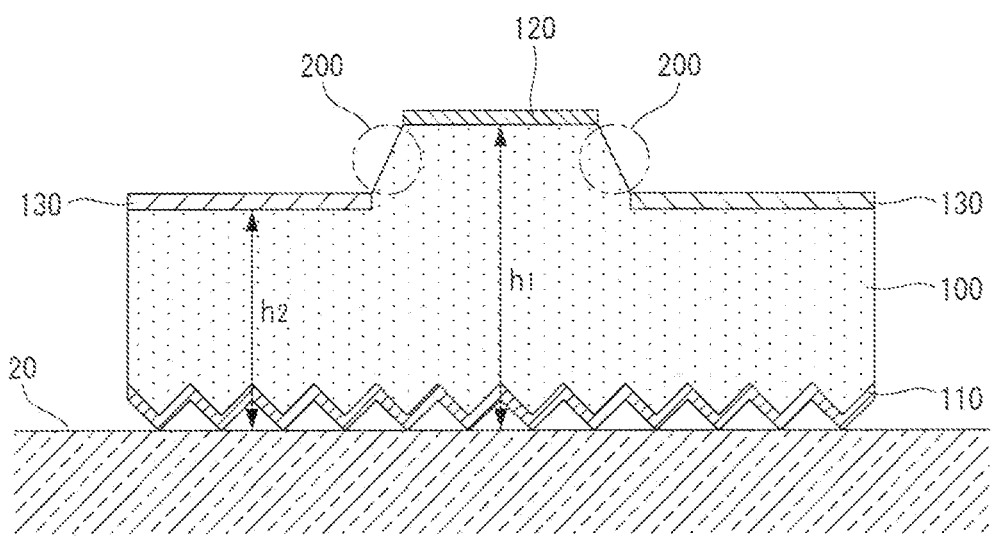

When the first portion 120 is a p-type impurity doped region and the second portion 130 is an n-type impurity doped region, the first portion 120 protrudes further than the second portion 130 for easily performing a manufacturing process, as shown in FIGS. 2A and 2B.

As described above, the first portion 120 and the second portion 130 are positioned on portions of the substrate 100 having different heights. More specifically, as shown in FIG. 2B, it is assumed that the solar cell according to the embodiment of the invention is positioned on a plane having a substantially even surface 20 so that the even surface 20 underlies the incident surface of the solar cell.

A first height h1 between the even surface 20 and the first portion 120 is greater than a second height h2 between the even surface 20 and the second portion 130, and a difference between the first height h1 and the second height h2 is similar to the height difference d1.

As shown in FIG. 2B, the third portion 200 between the first portion 120 and the second portion 130 has an inclined portion that has a predetermined inclination and connects the first portion 120 to the second portion 130.

Figure 4:
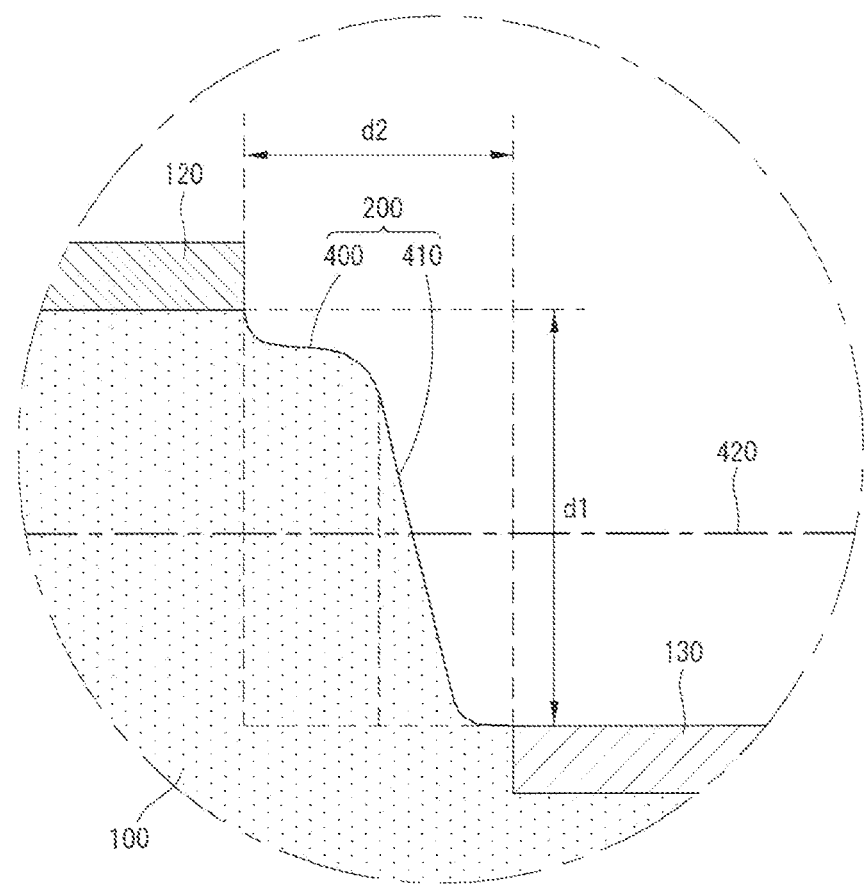

More specifically, as shown in FIG. 4, the third portion 200 includes a fourth portion 400 and a fifth portion 410 between the first portion 120 and the second portion 130. An inclination of the fourth portion 400 is less than an inclination of the fifth portion 410.

In the embodiment of the invention, the inclinations of the fourth and fifth portions 400 and 410 indicate an inclined level based on a horizontal axis of the substrate 100. More specifically, the fourth portion 400 has the relatively small inclination based on a horizontal axis 420 of the substrate 100, and the fifth portion 410 has the relatively large inclination based on the horizontal axis 420. In other words, the third portion 200 has a structure in which the surface of the third portion 200 is gently inclined and then is abruptly inclined based on the horizontal axis 420 of the substrate 100.

The fourth portion 400 is positioned adjacent to the first portion 120, and the fifth portion 410 is positioned adjacent to the second portion 130.

The first portion 120 and the second portion 130 are spaced apart from each other in the vertical and horizontal directions by the third portion 200 having the above-described structure.

Figure 5:
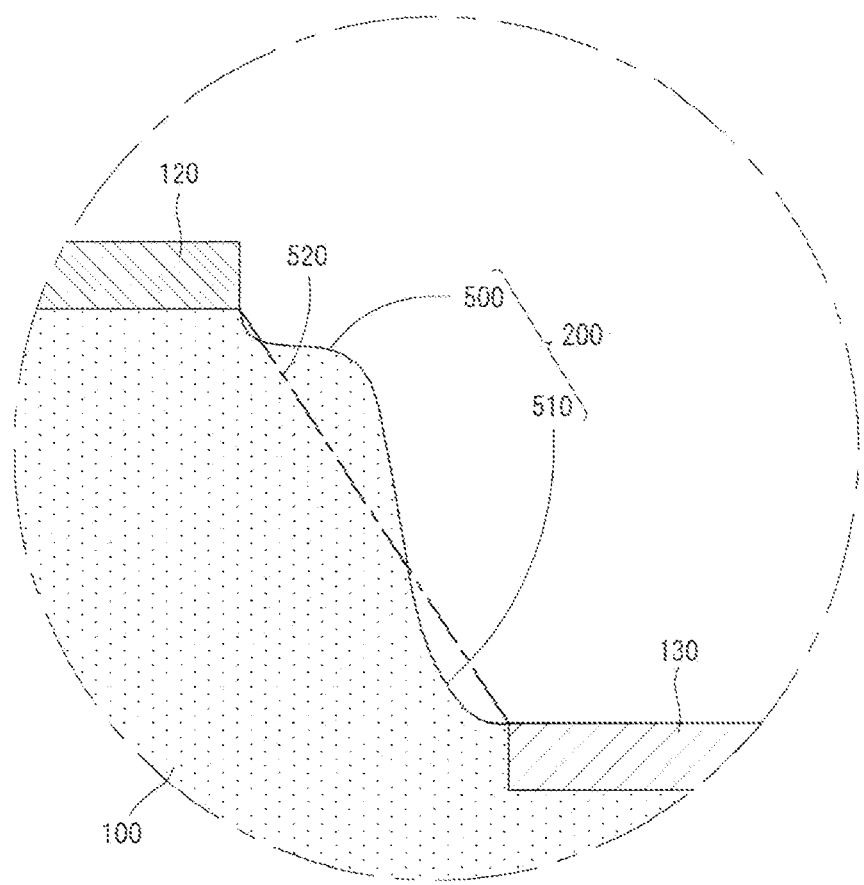

As another embodiment of the third portion 200, as shown in FIG. 5, when the lower surface of the first portion 120 is connected to the upper surface of the second portion 130 through an imaginary even inclined surface, the third portion 200 includes a portion 500 corresponding to a protrusion and a portion 510 corresponding to a depression based on an imaginary inclined surface 520. In other words, an inclined portion of the third portion 200 includes the protrusion 500 and the depression 510. The imaginary inclined surface 520 may be a shortest line of lines connecting the lower surface of the first portion 120 to the upper surface of the second portion 130.

Figure 6:
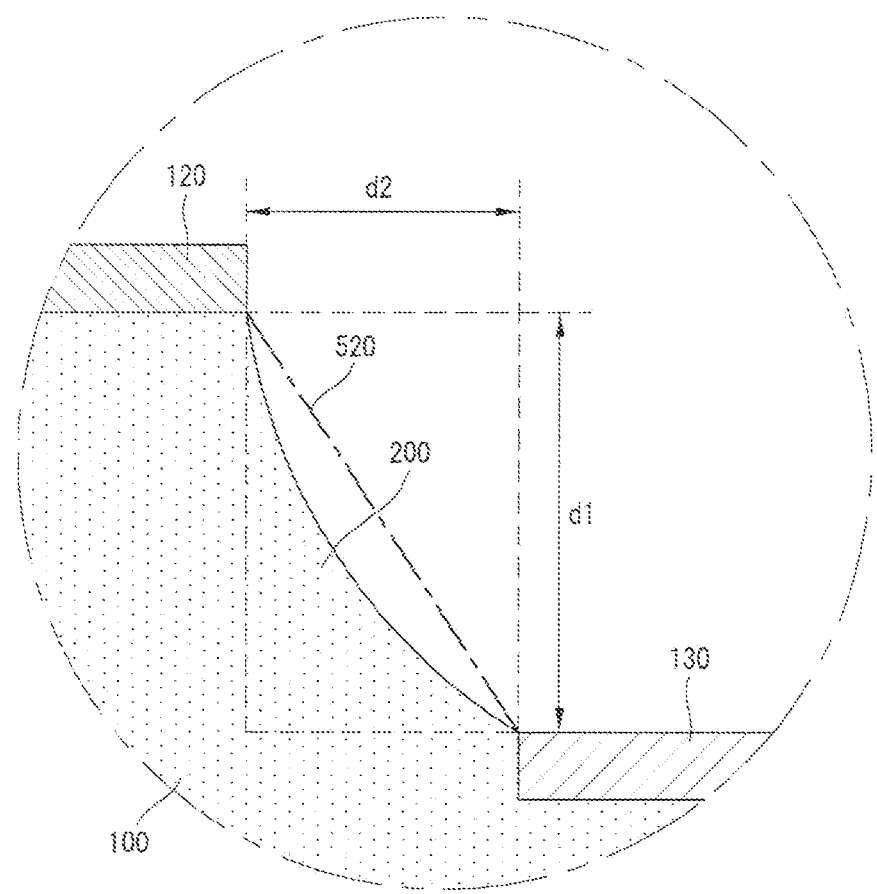

However, as shown in FIG. 6, the third portion 200 may include only a depression based on the imaginary inclined surface 520.

The first portion 120 and the second portion 130 are spaced apart from each other in the vertical and horizontal directions by the third portion 200 having the above-described shape.

Figure 7:
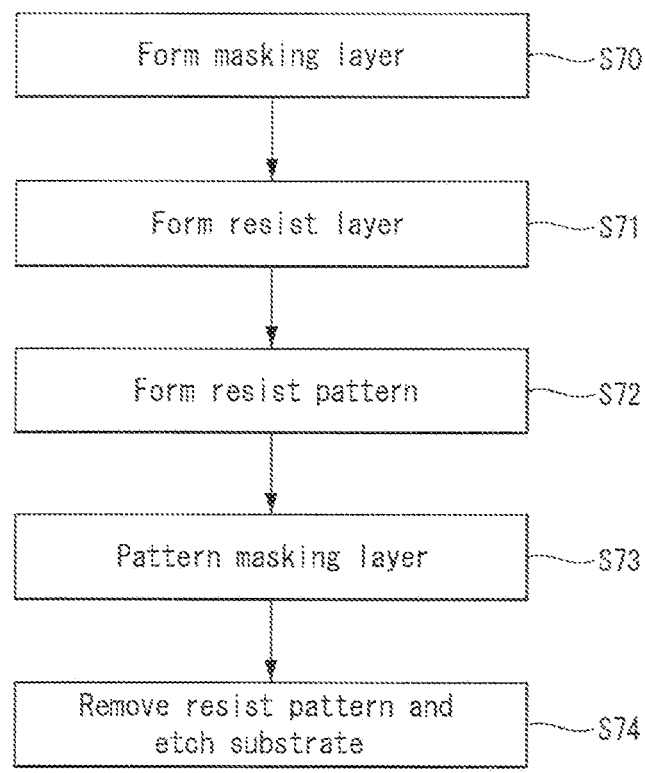
FIG. 7 is a process flow chart of a method for etching a substrate according to an embodiment of the invention.

A method for etching a substrate is described below with reference to FIG. 7. In the embodiment of the invention, FIG. 7 illustrates a method for etching a substrate used to manufacture a solar cell. However, the etching method illustrated in FIG. 7 may be used in other semiconductor devices than the solar cell.

FIG. 7 is a process flow chart of a method for etching a substrate according to an embodiment of the invention. As shown in FIG. 7, first, a masking layer is formed on a substrate in step S70. If the substrate is a substrate used to manufacture a solar cell, the substrate may be a semiconductor substrate formed of silicon. Next, a resist layer is formed on the masking layer in step S71. The resist layer may be formed using a resist paste through a screen printing method, for example.

Next, the resist layer is excessively light-cured or heat-cured using an exposure mask to form a resist pattern having a cured portion and a non-cured portion in step S72. In this case, the resist layer may be hardly cured by irradiating heat or light onto the resist layer. For example, a resist of the resist layer may be cross-linked by increasing an exposure level of the resist layer to heat or light 1.5 times more than a related art. Hence, the resist layer may be cured more hardly or firmly.

Next, the masking layer is patterned using the resist pattern in step S73. For example, when the substrate having the resist pattern is exposed to an etchant, a portion of the masking layer, that is not exposed to the etchant, is not etched by the cured portion of the resist pattern, and the non-cured portion of the resist pattern and the masking layer underlying the non-cured portion are etched by the etchant. In other words, the non-cured portion of the resist pattern and the masking layer underlying the non-cured portion may be together etched using an etchant having a high etch rate. The masking layer may be patterned through such a method.

The resist pattern remaining in the substrate is removed using the etchant, and the substrate is selectively etched using the masking layer as a mask in step S74.

A method for manufacturing a solar cell using the above substrate etching method is described in detail with reference to FIG. 8. Accordingly, the substrate etching method illustrated in FIG. 7 can be clearly understood through the following method for manufacturing the solar cell.

FIGS. 8 to 12 illustrate various examples of methods for manufacturing a solar cell according to embodiments of the invention.

A method for manufacturing a solar cell according to an embodiment of the invention is described with reference to FIGS. 8 and 9.

Figure 8:
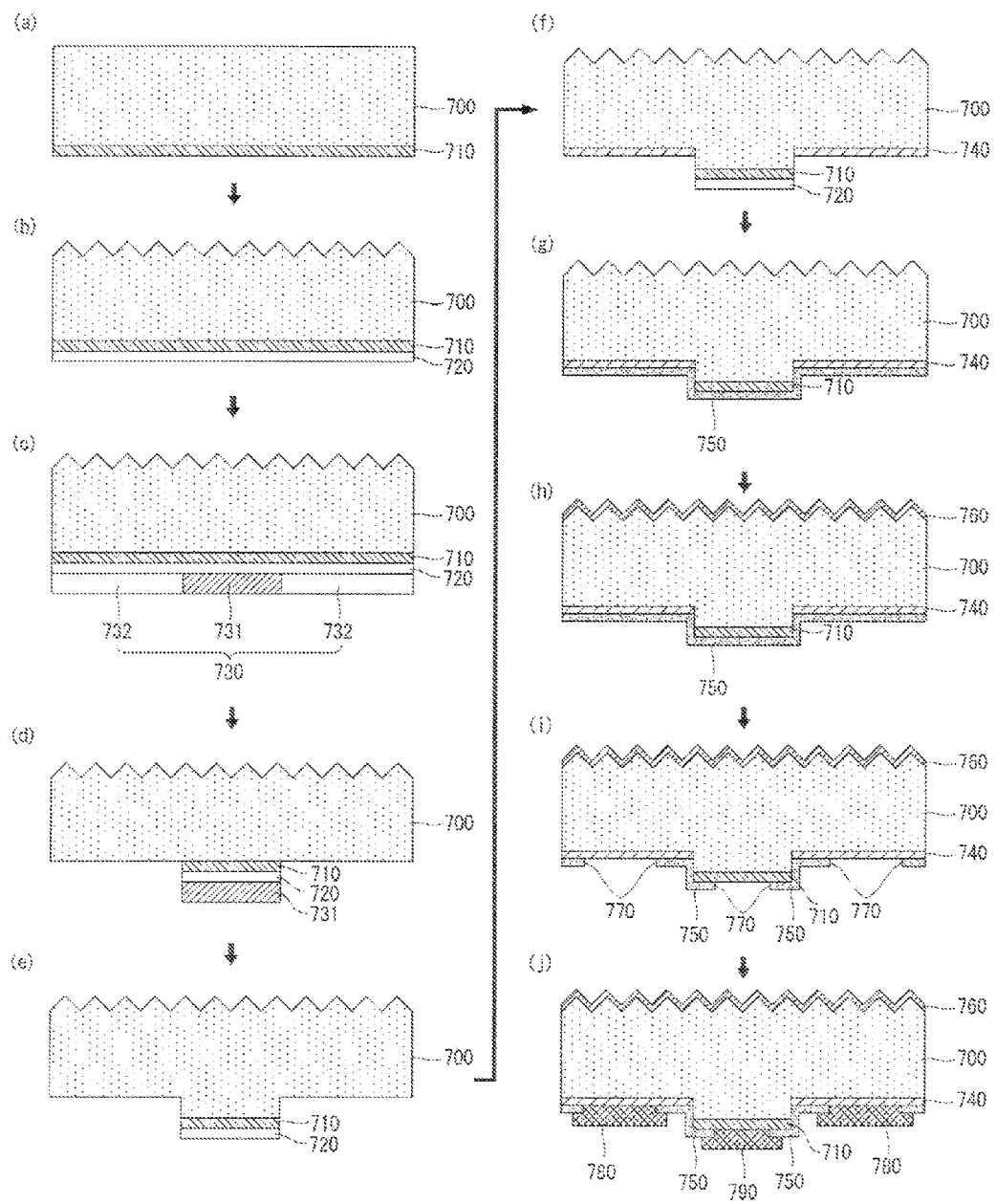
FIGS. 8 to 12 illustrate various examples of methods for manufacturing a solar cell according to embodiments of the invention.

First, as shown in (a) of FIG. 8, p-type impurities are doped on a silicon substrate 700 to form a p-type impurity layer 710. The silicon substrate 700 may be a silicon wafer or the substrate 100 shown in FIGS. 1 to 6. The p-type impurity layer 710 may be a p-type or $p^+$-type impurity layer. However, in the example embodiment, the p-type impurity layer 710 is a $p^+$-type impurity layer.

Next, as shown in (b) of FIG. 8, after a masking layer 720 is formed on the p-type impurity layer 710, a surface of the silicon substrate 700, on which the masking layer 720 is not formed, is etched to form a textured surface corresponding to an uneven surface. The masking layer 720 may be formed of silicon oxide (SiOx) or silicon nitride (SiNx).

Next, as shown in (c) of FIG. 8, a resist layer 730 is formed on the masking layer 720, and then light or heat is partially irradiated onto the resist layer 730 to form a resist pattern having a cured portion 731 (hereinafter referred to as "a first portion") and a non-cured portion 732 (hereinafter referred to as "a second portion"). If the resist layer 730 is formed of an organic material or an inorganic material, a substrate paste formed of an organic material or an inorganic material may be coated on the masking layer 720 using a screen printing method to form the resist layer 730. In this case, a resist of the resist layer 730 may be cross-linked by increasing an exposure level of the resist layer 730 to heat or light 1.5 times more than a related art. Hence, the cured portion 731 of the resist layer 730 may be cured more hardly or firmly.

Next, as shown in (d) of FIG. 8, the non-cured portion 732 of the resist layer 730, the masking layer 720 underlying the non-cured portion 732, and the p-type impurity layer 710 underlying the non-cured portion 732 are sequentially etched using a first etchant to expose a portion of the silicon substrate 700. A portion of the silicon substrate 700 after the etching illustrated in FIG. 8(d) is enlargedly shown in (a) of FIG. 9.

The first etchant used to etch the non-cured portion 732, the masking layer 720, and the p-type impurity layer 710 at a time may use an acid solution. Preferably, the first etchant may be an etchant based on inorganic acid containing at least one of hydrofluoric acid, nitric acid, acetic acid, sulfuric acid, and hydrochloric acid.

Because the first portion 731 of the resist layer 730 is excessively cured by increasing the exposure level of the resist layer 730 to heat or light in the curing process of the resist layer 730 illustrated in FIG. 8(c), the first portion 731 is not etched and remains in the silicon substrate 700 even if an etchant having high corrosion, such as an acid solution, is used as the first etchant. Further, in the example embodiment, the second portion 732 of the resist layer 730, the masking layer 720 underlying the second portion 732, and the p-type impurity layer 710 underlying the second portion 732 are etched through one etching process at a time. Therefore, because a process for developing the second portion 732, a process for etching a portion of the masking layer 720 using the first portion 731 as a mask, and a process for etching a portion of the p-type impurity layer 710 using the masking layer 720 as a mask do not need to be performed, time and the manufacturing cost required in the manufacturing process of the solar cell are reduced.

A portion of the p-type impurity layer 710 remaining in the silicon substrate 700 shown in FIG. 8(d) may be a first portion.

Next, as shown in (e) of FIG. 8, the first portion 731 of the resist layer 730 and an exposed portion of the substrate 700 are etched using a second etchant. An alkali solution may be used as the second etchant so as to more efficiently etch the resist layer 730.

Figure 9:
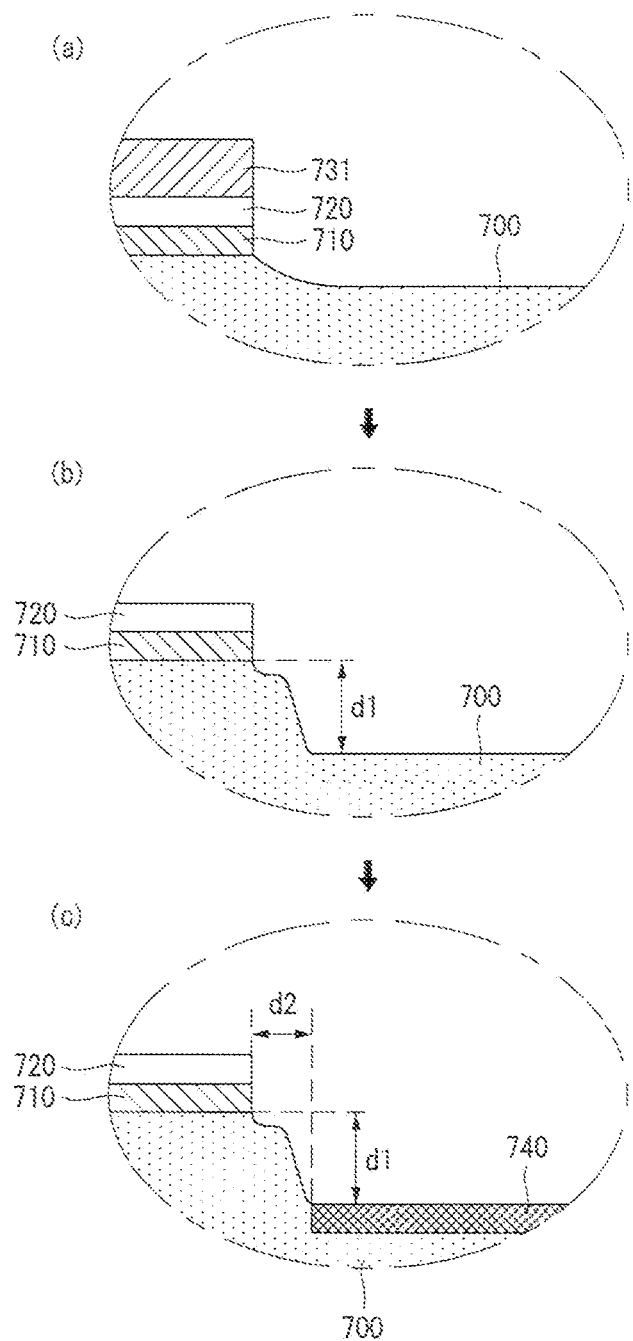

After the etching illustrated in FIG. 8(e), as shown in (b) of FIG. 9, a portion of the silicon substrate 700, on which the first portion 731 is not formed, is etched, and thus a thickness of the silicon substrate 700 is reduced by d1.

More specifically, when an exposed surface of the silicon substrate 700 is etched using the second etchant, the second etchant is prevented from penetrating in the silicon substrate 700 in a boundary portion of an end of the masking layer 720 because the masking layer 720 blocks the second etchant. Thus, an etching degree of a portion of the silicon substrate 700 adjacent to the masking layer 720 is different from an etching degree of a portion of the silicon substrate 700 that is not adjacent to the masking layer 720. Further, as shown in (b) of FIG. 9, because a thickness of the portion of the silicon substrate 700 adjacent to the masking layer 720 after etching is less than d1, a portion of the silicon substrate 700 has a protruding shape.

Next, as shown in (f) of FIG. 8 and (c) of FIG. 9, an n-type impurity layer 740 is formed on a portion of the silicon substrate 700 on which the masking layer 720 is not formed. The n-type impurity layer 740 may be an n-type layer or an $n^+$-type layer. Preferably, the n-type impurity layer 740 may be an $n^+$-type layer. The n-type impurity layer 740 may be formed using $POCl_3$ gas.

The n-type impurity layer 740 may be the second portion. Because the n-type impurity layer 740 is mainly formed not at the side of the exposed substrate 700 but on an even surface of the exposed substrate 700, the p-type impurity layer 710 and the n-type impurity layer 740 are positioned to be spaced apart from each other in vertical and horizontal directions as shown in (f) of FIG. 8 and (c) of FIG. 9.

Next, as shown in (g) of FIG. 8, the masking layer 720 is removed by etching. Then, a passivation layer 750 is formed on the p-type impurity layer 710 and the n-type impurity layer 740.

Next, as shown in (h) of FIG. 8, an anti-reflection layer 760 is formed on the textured surface of the silicon substrate 700.

Next, as shown in (i) of FIG. 8, a portion of the passivation layer 750 is removed to form a contact hole 770 for an electrode contact exposing a portion of the p-type impurity layer 710 underlying the passivation layer 750 and a portion of the n-type impurity layer 740 underlying the passivation layer 750.

Next, as shown in (j) of FIG. 8, a first electrode 790 electrically and physically connected to the p-type impurity layer 710 exposed by the contact hole 770 and a second electrode 780 electrically and physically connected to the n-type impurity layer 740 exposed by the contact hole 770 are formed. A portion of the first electrode 790 and a portion of the second electrode 780 are positioned on the passivation layer 750.

The solar cell shown in FIG. 1 may be manufactured using the manufacturing method of the solar cell illustrated in FIGS. 8 and 9.

Another method for manufacturing a solar cell according to an embodiment of the invention is described with reference to FIGS. 10 and 11. In the following description, structures and components identical or equivalent to those illustrated in FIGS. 8 and 9 are designated with the same reference numerals, and a further description may be briefly made or may be entirely omitted.

Figure 10:
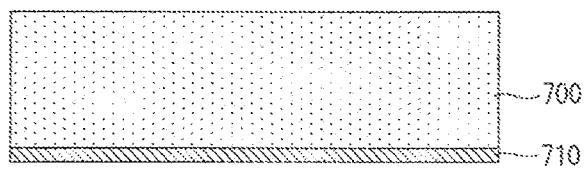
Figure 10:
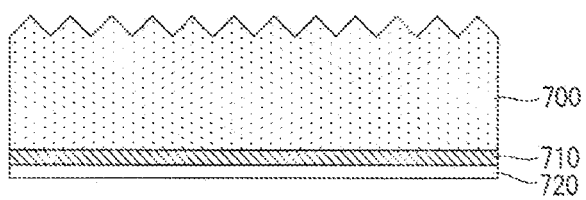
Figure 10:
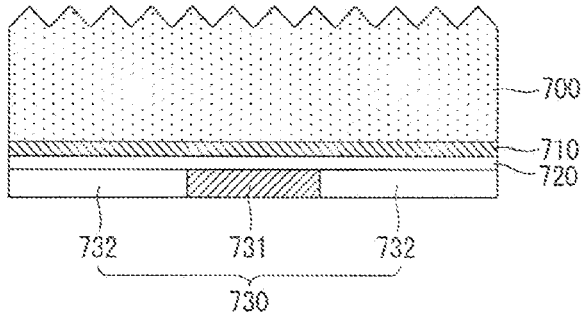
Figure 10:
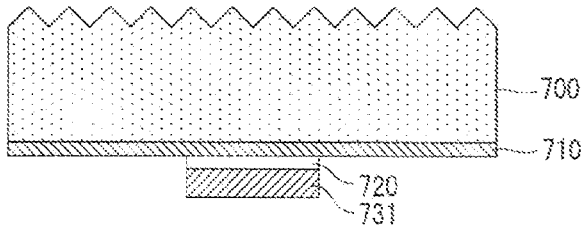
Figure 10:
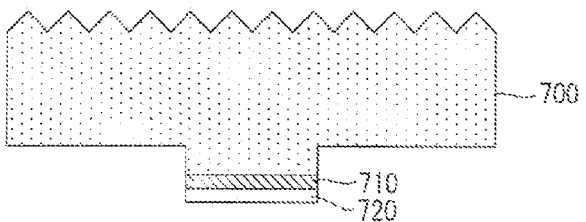

First, as shown in (a) to (c) of FIG. 10, a p-type impurity layer 710, a masking layer 720, and a resist layer 730 having a first portion 731 and a second portion 732 are sequentially formed on a silicon substrate 700 in the same manner as (a) to (c) of FIG. 8.

Figure 11:
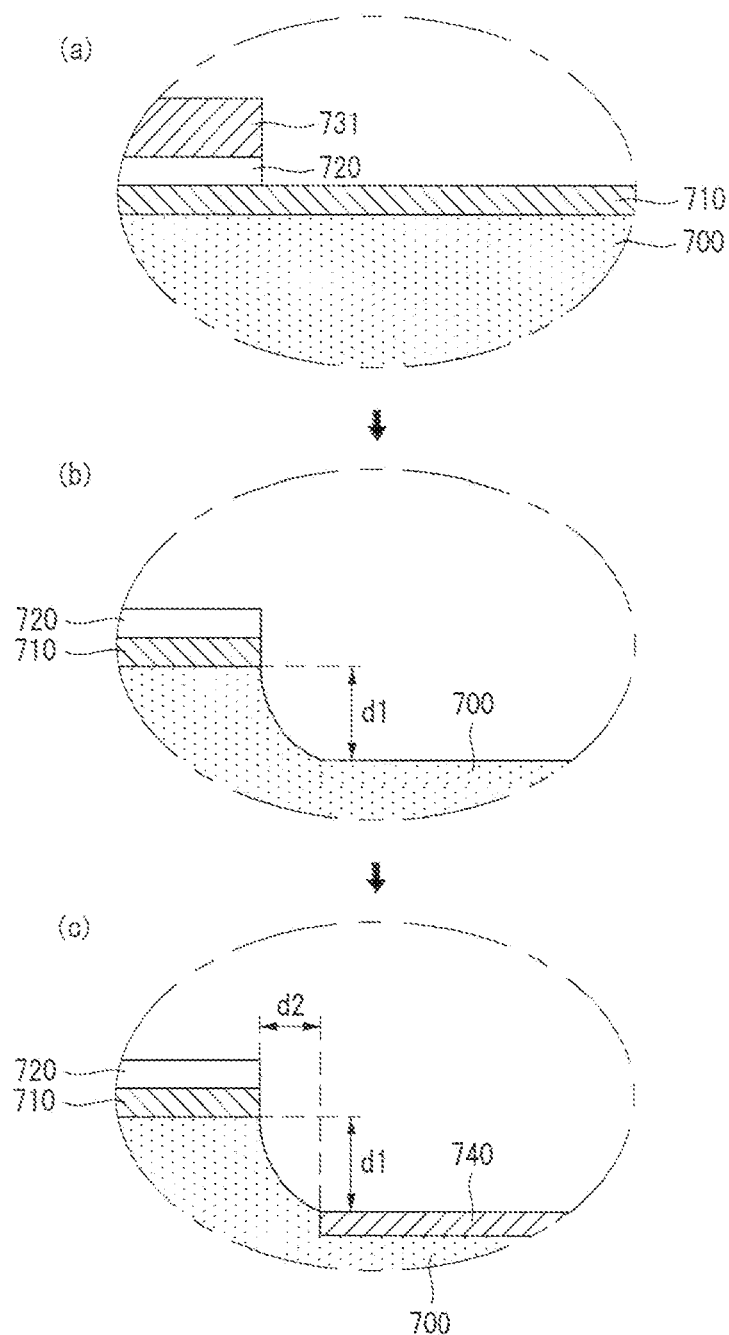

Next, as shown in (d) of FIG. 10 and (a) of FIG. 11, the second portion 732 of the resist layer 730 and the masking layer 720 underlying the second portion 732 are removed through etching at a time. An acid etchant may be used to etch the second portion 732 of the resist layer 730 and the masking layer 720 underlying the second portion 732.

Next, as shown in (e) of FIG. 10, the first portion 731 of the resist layer 730 and an exposed portion of the p-type impurity layer 710 are removed through etching using an etchant having strong alkali properties at a time. The etchant has the alkali properties stronger than the second etchant illustrated in FIGS. 8 and 9.

Because the first portion 731 of the resist layer 730 has a strong corrosion resistance, an etching degree of the first portion 731 may be less than an etching degree of the p-type impurity layer 710. Hence, while the first portion 731 is removed through etching using a strong alkali etchant, the exposed portion of the p-type impurity layer 710 is etched. Further, a portion of the silicon substrate 700 underlying the p-type impurity layer 710 is etched.

Thus, as shown in (b) of FIG. 11, the p-type impurity layer 710 and a portion of the silicon substrate 700 underlying the p-type impurity layer 710 are together etched in a portion in which the second portion 732 of the resist layer 730 is removed, and thus a thickness of the silicon substrate 700 is reduced by d1.

Because the strong alkali etchant does not deeply penetrate in the silicon substrate 700 in a boundary portion of an end of the masking layer 720, the silicon substrate 700 is gently inclined at the end of the masking layer 720 and thus has a relatively depressed portion as shown in (b) of FIG. 11. As above, because the first portion 731 of the resist layer 730 and a portion of the p-type impurity layer 710 are etched through one etching process at a time, the number of manufacturing processes and manufacturing time are reduced.

Next, as shown in (f) of FIG. 8 and (c) of FIG. 11, an n-type impurity layer 740 is formed on the exposed silicon substrate 700. As described above, because the n-type impurity layer 740 is mainly formed not at the side of the exposed substrate 700 but on an even surface of the exposed substrate 700, the p-type impurity layer 710 and the n-type impurity layer 740 are positioned to be spaced apart from each other in vertical and horizontal directions.

Next, the solar cell shown in FIG. 6 is manufactured through the processes illustrated in (g) to (j) of FIG. 8. As shown in (c) of FIG. 11, in the manufactured solar cell, an inclined portion between the p-type impurity layer 710 and the n-type impurity layer 740 includes a depression based on an imaginary inclined surface.

Another method for manufacturing a solar cell according to an embodiment of the invention is described with reference to FIG. 12. In the following description, structures and components identical or equivalent to those illustrated in FIGS. 8 to 11 are designated with the same reference numerals, and a further description may be briefly made or may be entirely omitted.

Figure 12:
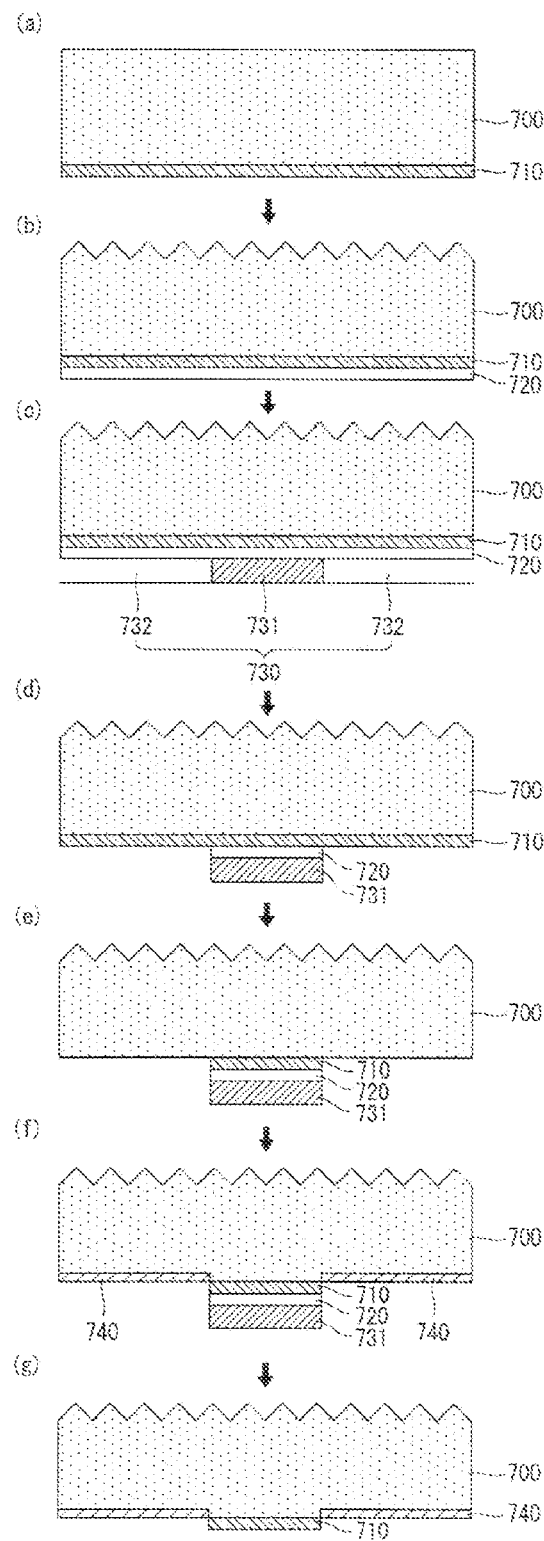

First, as shown in (a) to (c) of FIG. 12, a p-type impurity layer 710, a masking layer 720, and a resist layer 730 having a first portion 731 and a second portion 732 are sequentially formed on a silicon substrate 700 in the same manner as (a) to (c) of FIG. 10.

Next, as shown in (d) of FIG. 12, the second portion 732 of the resist layer 730 and the masking layer 720 underlying the second portion 732 are removed through etching at a time in the same manner as (d) of FIG. 10.

Next, as shown in (e) of FIG. 12, an exposed portion of the p-type impurity layer 710 is etched. In this case, the first portion 731 of the resist layer 730 is not etched.

Next, as shown in (f) of FIG. 12, an n-type impurity layer 740 is formed on an exposed portion of the silicon substrate 700.

Next, as shown in (g) of FIG. 12, the first portion 731 of the resist layer 730 and the masking layer 720 underlying the first portion 731 are together etched. When the masking layer 720 is etched using an acid etchant such as hydrofluoric acid, the first portion 731 formed on the masking layer 720 may be lifted off and may be removed.

As above, because the masking layer 720 and the first portion 731 of the resist layer 730 are together removed, the number of manufacturing processes is reduced. Hence, the manufacturing cost and manufacturing time are reduced.

Although the explanation was given of an example of a back contact solar cell in the embodiment of the invention, the embodiment of the invention may be applied to other solar cells than the back contact solar cell.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a semiconductor layer containing first impurities;
a first portion positioned in and directly contacting a back surface of the semiconductor layer, the first portion being more heavily doped with second impurities different from the first impurities than the semiconductor layer, and forms a p-n junction with the semiconductor layer;
a second portion positioned in and directly contacting the back surface of the semiconductor layer, the second portion being more heavily doped with the first impurities than the semiconductor layer;
a third portion positioned in and directly contacting the back surface of the semiconductor layer between the first portion and the second portion, the third portion having an impurity concentration lower than an impurity concentration of the first portion and an impurity concentration of the second portion and substantially equal to or higher than an impurity concentration of the semiconductor layer;
a first electrode which is positioned on the back surface of the semiconductor layer and is connected to the first portion;
a second electrode which is positioned on the back surface of the semiconductor layer and is connected to the second portion;
a passivation layer formed on the back surface of the semiconductor layer including the first portion, the second portion and the third portion, and having contact holes corresponding to the first portion and the second portion; and
a double-layered anti-reflection layer formed on a front surface of the substrate, and including silicon nitride and silicon dioxide,
wherein the back surface of the semiconductor layer directly contacts the first portion and the second portion, and the first portion and the second are spaced apart from each other by the third portion in a horizontal direction and a vertical direction,
wherein the first portion is disconnected with the second portion, and
wherein the first portion is parallel with the second portion along an extending direction perpendicular to the vertical and horizontal directions.

2. The solar cell of claim 1, wherein the first impurities are n-type impurities, and the second impurities are p-type impurities.

3. The solar cell of claim 1, wherein one of the first electrode and the second electrode is disposed higher than the other.

4. The solar cell of claim 3, wherein the back surface of the semiconductor layer directly contacting the third portion includes a depression.

5. The solar cell of claim 3, wherein the back surface of the semiconductor layer directly contacting the third portion includes a protrusion.

6. The solar cell of claim 3, wherein the back surface of the semiconductor layer directly contacting the third portion includes a fourth portion having a first inclination and a fifth portion having a second inclination between the first portion and the second portion, the second inclination being greater than the first inclination.

7. The solar cell of claim 6, wherein the fourth portion and the fifth portion are protrusions.

8. The solar cell of claim 6, wherein the first portion is positioned closer to the fourth portion than the fifth portion.

9. The solar cell of claim 1, further comprising an anti-reflection layer on a front surface opposite the back surface of the semiconductor layer.

10. The solar cell of claim 9, wherein the front surface opposite the back surface of the semiconductor layer is an incident surface on which light is incident.

11. The solar cell of claim 1, wherein the third portion has at least one protrusion and at least one depression.

12. The solar cell of claim 1, wherein the third portion has a plurality of protrusion having different slopes.

13. The solar cell of claim 1, wherein the third portion has a first interval in the vertical direction and a second interval in the horizontal direction, and wherein the first interval is one of greater than, equal to, and less than the second interval.

14. The solar cell of claim 1, wherein the anti-reflective layer on the front surface has a textured surface.

* * * * *